(12) United States Patent
Wang et al.

(10) Patent No.: US 11,652,081 B2
(45) Date of Patent: May 16, 2023

(54) METHOD FOR MANUFACTURING SEMICONDUCTOR PACKAGE STRUCTURE

(71) Applicant: Advanced Semiconductor Engineering, Inc., Kaohsiung (TW)

(72) Inventors: Yi Dao Wang, Kaohsiung (TW); Tung Yao Lin, Kaohsiung (TW); Rong He Guo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 82 days.

(21) Appl. No.: 17/233,245

(22) Filed: Apr. 16, 2021

(65) Prior Publication Data
US 2022/0336406 A1    Oct. 20, 2022

(51) Int. Cl.
*H01L 23/00*    (2006.01)
(52) U.S. Cl.
CPC .............. *H01L 24/81* (2013.01); *H01L 24/83* (2013.01); *H01L 2224/81224* (2013.01); *H01L 2224/83224* (2013.01)

(58) Field of Classification Search
CPC . H01L 24/81; H01L 24/83; H01L 224/81224; H01L 2224/83224; H01L 2224/81224
See application file for complete search history.

(56) References Cited

U.S. PATENT DOCUMENTS 10,763,129 B2    9/2020    Yoon et al.
2019/0287816 A1*    9/2019    Yoon ........................ H01L 24/75

\* cited by examiner

*Primary Examiner* — Dale E Page
*Assistant Examiner* — Wilner Jean Baptiste
(74) *Attorney, Agent, or Firm* — Foley & Lardner LLP (57) ABSTRACT

A method for manufacturing a semiconductor package structure is provided. The method includes: (a) providing a semiconductor structure including a first device and a second device; (b) irradiating the first device by a first energy-beam with a first irradiation area; and (c) irradiating the first device and the second device by a second energy-beam with a second irradiation area greater than the first irradiation area of the first energy-beam.

19 Claims, 10 Drawing Sheets

METHOD FOR MANUFACTURING SEMICONDUCTOR PACKAGE STRUCTURE

BACKGROUND

1. Field of the Disclosure

The present disclosure relates to a method for manufacturing a semiconductor package structure, and in particularly to a method by using energy-beams to form bonding joints.

2. Description of the Related Art

Based on laser's quick heating property, laser assisted bonding (LAB) has been used to replace a conventional reflow process to melt bumps, solder balls, pads and/or other electrical connecting elements to achieve the purpose of fine pitch flip chip bonding. However, due to different thermal conductivity of different materials, LAB may be prone to damaging materials, such as epoxy molding compound or a substrate. In order to solve aforementioned problems, a new method for manufacturing a semiconductor package structure is required.

SUMMARY

In some embodiments, a method for manufacturing a semiconductor package structure includes: (a) providing a semiconductor structure including a first device and a second device; (b) irradiating the first device by a first energy-beam with a first irradiation area; and (c) irradiating the first device and the second device by a second energy-beam with a second irradiation area greater than the first irradiation area of the first energy-beam.

In some embodiments, a method for manufacturing a semiconductor package structure includes: (a) providing a substrate, a first device and a second device, wherein the first device and the second device are disposed on the substrate; (b) heating the first device by a first energy-beam with a first power; and (c) heating the first device and the second device by a second energy-beam with a second power, wherein the second power is greater than the first power.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
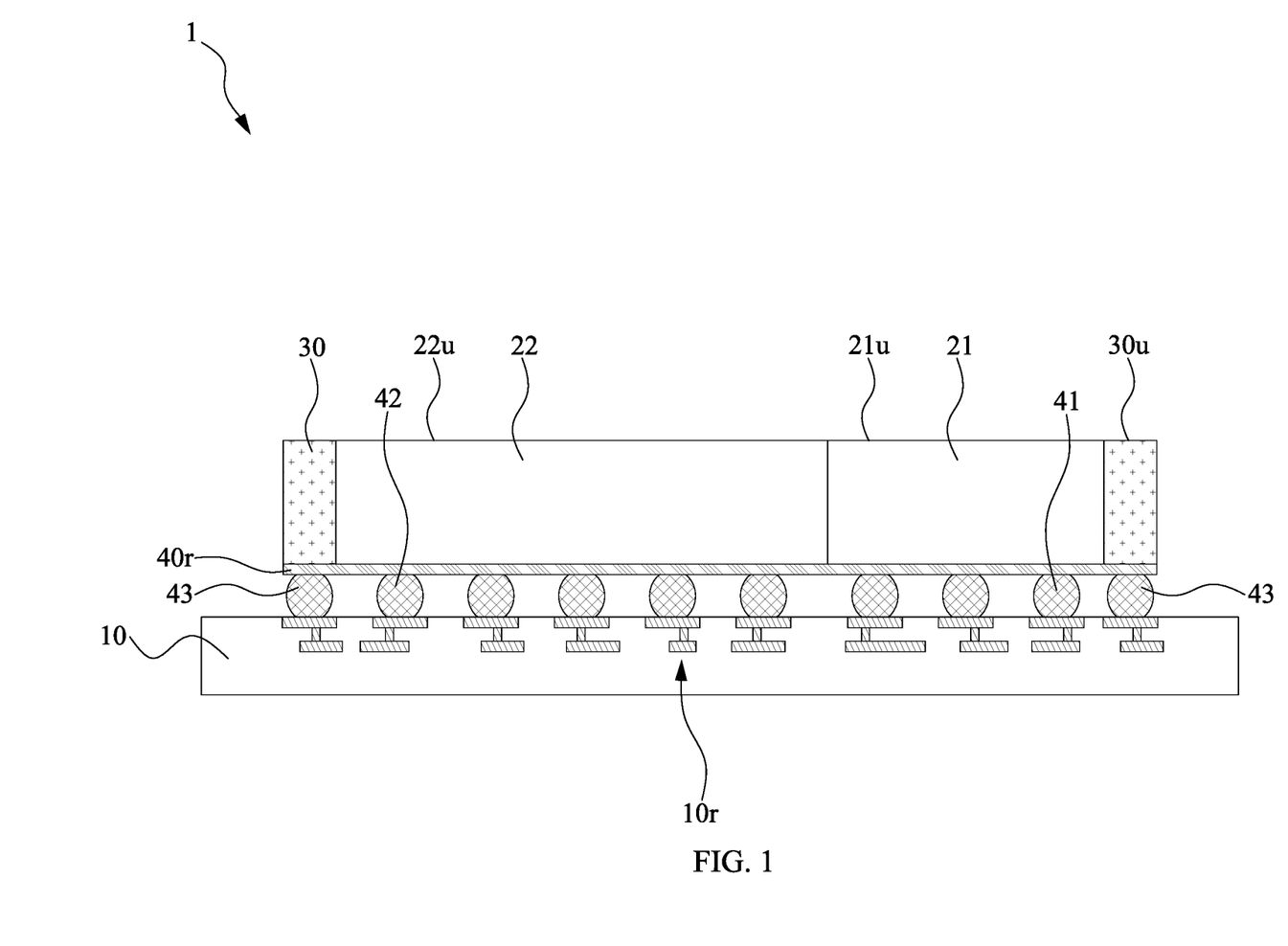
FIG. 1 illustrates a cross-sectional view of an example of a semiconductor structure according to some embodiments of the present disclosure.

FIG. 1 illustrates a cross-sectional view of an example of a semiconductor structure 1 according to some embodiments of the present disclosure.

In some embodiments, the semiconductor structure 1 may include a substrate 10, a device 21, a device 22, a package body 30, a conductive structure 40r, electrical connectors 41, 42 and 43.

The substrate 10 may include, for example, a semiconductor substrate, an insulating core substrate, a printed circuit board or other suitable substrates. The semiconductor substrate may include a bulk semiconductor, a semiconductor-on-insulator (SOI) substrate, or the like. The insulating core substrate may include, a fiberglass reinforced resin core (e.g., FR4), a Prepreg (PP), Ajinomoto build-up film (ABF), a photo-sensitive material or other suitable materials. The printed circuit board may include, for example, a paper-based copper foil laminate, a composite copper foil laminate, or a polymer-impregnated glass-fiber-based copper foil laminate. The substrate 10 may include redistribution layer(s) (RDLs) 10r or traces for electrical connection.

The device 21 and the device 22 may be disposed on the substrate 10. The device 21 and/or the device 22 may include, for example, an active device, such as a semiconductor die or a chip. The device 21 and/or the device 22 may include a logic die (e.g., system on a chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or combinations thereof.

The device 21 and/or the device 22 may include a substrate (e.g., a silicon substrate) and circuit(s) embedded therein. In some embodiments, the device 21 and the device 22 may be disposed side-by-side. In some embodiments, the device 21 and the device 22 may be disposed side-by-side and coupled to a same surface of the substrate 10. In some embodiments, the device 21 may be in contact with the device 22. For example, the lateral surface of the device 21 may be in contact with the lateral surface of the device 22. In other some embodiments, the device 21 may be separated from the device 22. For example, the lateral surface of the device 21 may be separated from the lateral surface of the device 22, and there is a gap between them.

The package body 30 may be disposed on the substrate 10. In some embodiments, the package body 30 may surround the device 21 and the device 22. In some embodiments, the package body 30 may surround and cover the lateral surfaces of the device 21 and the device 22. The package body 30 may be made of molding material that may include, for example, a Novolac-based resin, an epoxy-based resin, a silicone-based resin, or other another suitable encapsulant. Suitable fillers may also be included, such as powdered $SiO_2$. In some embodiments, a surface (or upper surface) 21u of the device 21 may be exposed from the package body 30, and a surface (or upper surface) 22u of the device 22 may be exposed from the package body 30. That is, the surface 21u of the device 21 and the surface 22u of the device 22 may be substantially free from covering of the package body 30. The surface 21u of the device 21 may be substantially coplanar with the surface 22u of the device 22 and a surface (or upper surface) 30u of the package body 30. In some embodiments, the surface 21u of the device 21, the surface 22u of the device 22 and the surface 30u of the package body 30 may be at different elevations.

The conductive structure 40r may be disposed on the lower surfaces of the package body 30, device 21 and the device 22. The conductive structure 40r may be configured to electrically connect the electrical connectors 41 and 42 to the devices 21 and 22, respectively. The conductive structure 40r may include, for example, a redistribution structure, which may include dielectric layer(s), patterned conductive layer(s), and conductive via(s).

The electrical connectors 41 may be disposed between the device 21 and the substrate 10. The electrical connectors 42 may be disposed between the device 22 and the substrate 10. The electrical connectors 43 may be disposed between the package body 30 and the substrate 10. The electrical connectors 41, 42 may joint the conductive element(s) (e.g., the RDL 10r) of the substrate 10 and the conductive elements (e.g., the pads) of the devices 21 and 22. The electrical connectors 41, 42 and/or 43 may include, for example, solder balls, controlled collapse chip connection (C4) bumps, micro bumps or other suitable electrical connectors. The electrical connectors 41, 42 and/or 43 may be formed of bonding material(s). In some embodiments, the electrical connectors 41, 42 and/or 43 may include a conductive bonding material such as copper, aluminum, gold, nickel, silver, palladium, tin, other conductive bonding materials or a combination thereof. In some other embodiments, the method of the present disclosure may be carried out without the presence of the electrical connectors 41, 42 and/or 43 and a direct bonding between the substrate 10 and the device 21 or 22 may be formed. In some other embodiments, the method of the present disclosure may be applied to direct bonding technique.

In some embodiments, energy-beam(s) is used to provide heat to an interface between the substrate 10 and the device 21 or 22 for forming bonding joints. For example, in some embodiments, energy-beam(s) is used to provide heat such that the material of electrical connectors 41, 42 and/or 43 may be melted or fused and form the electrical connectors 41, 42 and/or 43 after cooling (or annealing). The energy-beam(s) may irradiate the upper surfaces of the device 21, the device 22 and the package body 30 and transmit heat to the interface. In some embodiments, the energy-beam(s) is laser. In some embodiments, a laser assisted bonding (LAB) technique is adopted to provide energy-beam(s) for forming bonding joints.

FIGS. 2A, 2B, 2C and 2D illustrate top views of various stages of a method for manufacturing a semiconductor package structure according to some embodiments of the present disclosure. Specifically, FIGS. 2A, 2B, 2C and 2D illustrate how to form the electrical connectors 41, 42 and/or 43 by irradiating with energy-beam(s). In some embodiments, LAB technique may be used in the method illustrated in FIGS. 2A, 2B, 2C and 2D. In some embodiments, bonding material(s) may be disposed on a lower surface of the device 21, a lower surface of the device 22 and a lower surface of the package body 30, respectively, although they are not showed in FIGS. 2A, 2B, 2C and 2D. The energy-beams used in LAB may be a laser beam. The wavelength, power or power intensity of the energy-beams can be adjusted depending on the material for forming bonding joints. In some embodiments, the energy-beams may be laser beams and may have a wavelength ranging from about 600 nm to about 1100 nm (e.g., 600 nm, 700 nm, 800 nm, 900 nm, 1000 nm or 1100 nm). In some embodiments, the wavelength of the laser beams may be in the range of infrared radiation.

Figure 2A:
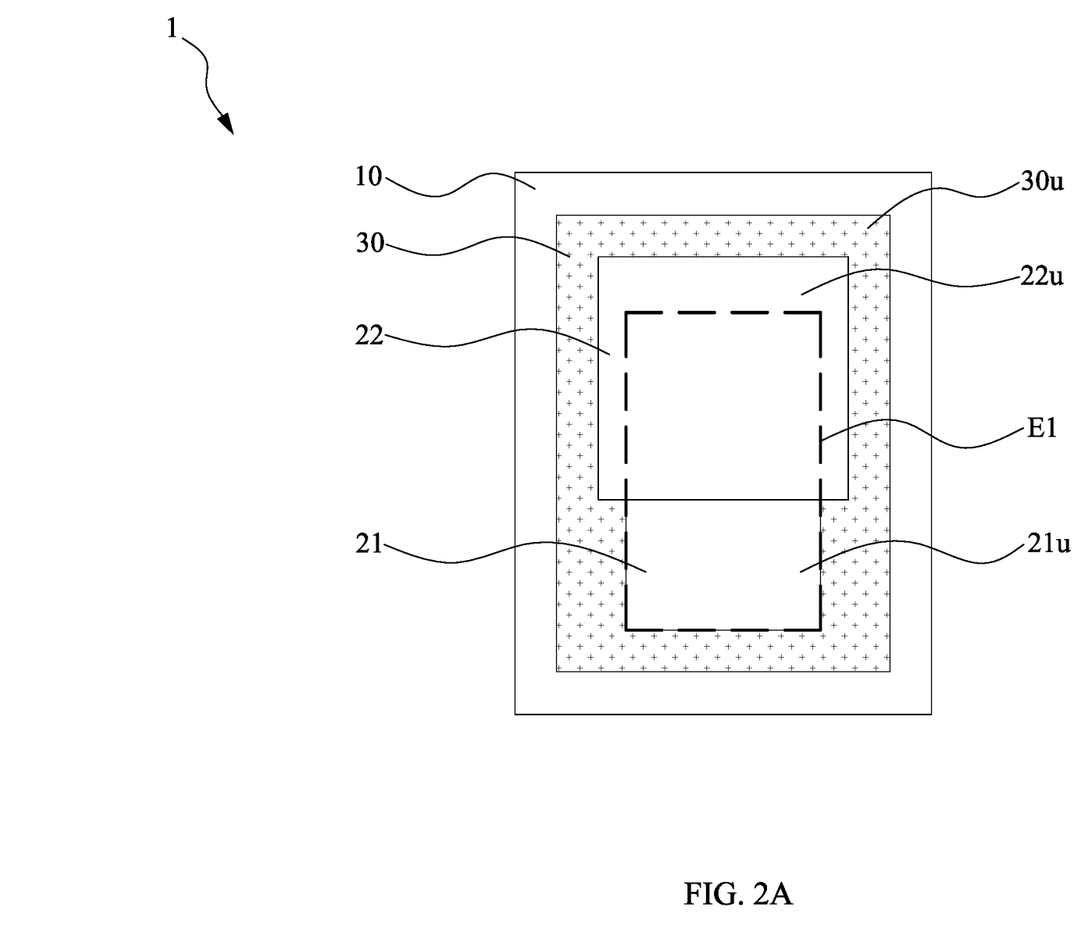
FIGS. 2A, 2B, 2C and 2D illustrate top views of various stages of a method for manufacturing a semiconductor package structure according to some embodiments of the present disclosure.

Referring to FIG. 2A, a semiconductor structure 1 may be provided. The device 21 and the device 22 may be arranged side-by-side. In some embodiments, the package body 30 may expose the surface 21u of the device 21 and the surface 22u of the device 22. In some embodiments, a surface area of the surface 21u of the device 21 may be different from a surface area of the surface 22u of the device 22. For example, the surface area of the surface 21u of the device 21 may be less than the surface area of the surface 22u of the device 22.

In some embodiments, the method of manufacturing a semiconductor package structure may include Step I: irradiating the device 21 by an energy-beam E1. The energy-beam E1 may be used to heat the material for forming bonding joints (e.g., bonding material(s)) disposed on or at the lower surface of the device 21 through irradiating the device 21. The energy-beam E1 may cover the surface 21u of the device 21. In some embodiments, the energy-beam E1 may cover the entire upper surface (e.g., the surface 21u) of the device 21. In some embodiments, the energy-beam E1 may also heat the material for forming bonding joints (e.g., bonding material(s)) disposed on or at the lower surface of the device 22 through irradiating the device 22. In some embodiments, the surface 22u of the device 22 has an edge spaced from the first irradiation area of the first energy-beam. In some embodiments, a smallest distance between an edge of the surface 22u of the device 22 and the first irradiation area (i.e., a peripheral edge of the first irradiation area) of the first energy-beam is greater than zero. In some embodiments, the energy-beam E1 may cover at least a portion of the surface 22u of the device 22, and the covered portion of the surface 22u is irradiated by the energy-beam E1 while the uncovered portion of the surface 22u is substantially free from irradiating of the energy-beam E1. In some embodiments, the surface 30u of the package body 30 may be substantially free from being irradiated by the energy-beam E1.

The energy-beam E1 may have a first irradiation area on an upper surface of the semiconductor structure 1. In this disclosure, the term "irradiation area" may be calculated based on a projection area of the energy-beam on the upper surface, including the surfaces 21u, 22u and 30u, of the semiconductor structure 1. The term "irradiation area" in this disclosure may also be referred to as "beam size." In some embodiments, the first irradiation area is greater than the surface area of the surface 21u of the device 21. The energy-beam E1 may have a first power. In some embodiments, the first power may range from about 80 W to about 200 W, such as 80 W, 90 W, 110 W, 130 W, 150 W, 170 W, 190 W or 200 W. The energy-beam E1 may have a first power intensity (i.e., power per unit area). In some embodiments, the first power intensity may range from about 0.6 W/mm$^2$ to about 1.6 W/mm$^2$, such as 0.6 W/mm$^2$, 0.8 W/mm$^2$, 1.0 W/mm$^2$, 1.2 W/mm$^2$, 1.4 W/mm$^2$ or 1.6 W/mm$^2$. The emission time of the energy-beam E1 may range from about 450 ms to about 1200 ms, such as 450 ms, 600 ms, 800 ms, 1000 ms or 1200 ms. The emission time of the energy-beam E1 may be adjusted depending on the selected power or power intensity of E1. In some embodiments, in Step I, the material for forming bonding joints disposed on or at the lower surface of the device 21 may be melted or partially melted to form a joint structure (i.e., the electrical connectors 41 as shown in FIG. 1).

Figure 2B:
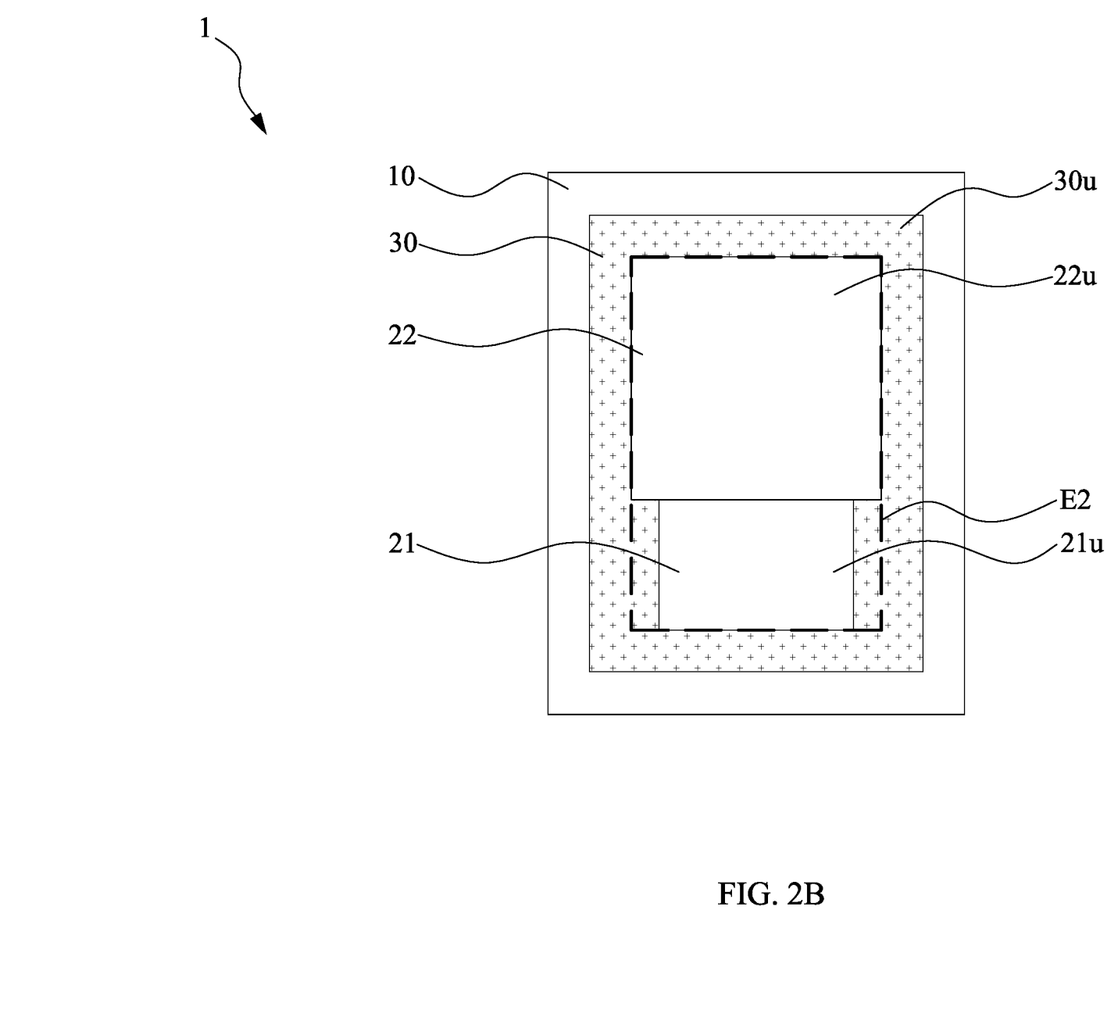

Referring to FIG. 2B, the method of manufacturing a semiconductor package structure may include Step II: irradiating the device 21 and the device 22 by an energy-beam E2. The energy-beam E2 may be used to heat the material for forming bonding joints (e.g., bonding material(s)) disposed on or at the lower surface of the device 22 through irradiating the device 22. The energy-beam E2 may cover the surface 21u of the device 21 and the surface 22u of the device 22. In some embodiments, the energy-beam E2 may cover the entire upper surface (e.g., the surface 22u) of the device 22 and the entire upper surface (e.g., the surface 21u) of the device 21. In some embodiments, the energy-beam E2 may cover at least a portion of the surface 30u of the package body 30, and the covered portion of the surface 30u is irradiated by the energy-beam E2 while the uncovered portion of the surface 30u is substantially free from irradiating of the energy-beam E2.

The energy-beam E2 may have a second irradiation area on the upper surface of the semiconductor structure 1. In some embodiments, the second irradiation area of the energy-beam E2 may be greater than the first irradiation area of the energy-beam E1. In some embodiments, the second irradiation area of the energy-beam E2 may be greater than a sum of the surface area of the surface 21u of the device 21 and the surface area of the surface 22u of the device 22. The energy-beam E2 may have a second power. In some embodiments, the second power may be less than first power. In some embodiments, the second power may range from about 60 W to about 150 W, such as 60 W, 80 W, 100 W, 120 W, 140 W or 150 W. The energy-beam E2 may have a second power intensity. In some embodiments, the second power intensity may be less than the first power intensity. In some embodiments, the second power intensity may range from about 0.40 W/mm$^2$ to about 1.2 W/mm$^2$, such as 0.40 W/mm$^2$, 0.60 W/mm$^2$, 0.80 W/mm$^2$, 1.0 W/mm$^2$ or 1.2 W/mm$^2$. In some embodiments, the emission time of the energy-beam E2 may be greater than the emission time of the energy-beam E1. In some embodiments, the emission time of the energy-beam E2 may range from about 600 ms to about 1800 ms, such as 600 ms, 800 ms, 1000 ms, 1200 ms, 1400 ms 1600 ms or 1800 ms. The emission time of the energy-beam E2 may be adjusted depending on the selected power or power intensity of E2.

The semiconductor structure 1 may receive a first energy per unit of irradiated area from the energy-beam E1 in Step I and a second energy per unit of irradiated area from the energy-beam E2 in Step II. In some embodiments, the second energy per unit of irradiated area may be close to or substantially the same as the first energy per unit of irradiated area. In some embodiments, the second energy per unit of irradiated area may range from about 0.6 times to 1.5 times of the first energy per unit of irradiated area, such as 0.6 times, 0.8 times, 0.9 times, 1.0 time, 1.1 times, 1.2 times, 1.3 times or 1.5 times of the first energy per unit of irradiated area. In this disclosure, the energy per unit of irradiated area may refer to a total energy that the unit area of the semiconductor structure 1 receives upon irradiated by the energy-beam in a specified step and the energy per unit of irradiated area may also be referred to as "energy density." The energy per unit of irradiated area may satisfy the following equation: power*emission time/(a total of the irradiated area). In some embodiments, in Step II, the material(s) for forming bonding joints disposed on or at the lower surface of the device 22 may be melted or partially melted to form a joint structure (i.e., the electrical connectors 42 as shown in FIG. 1).

Figure 2C:
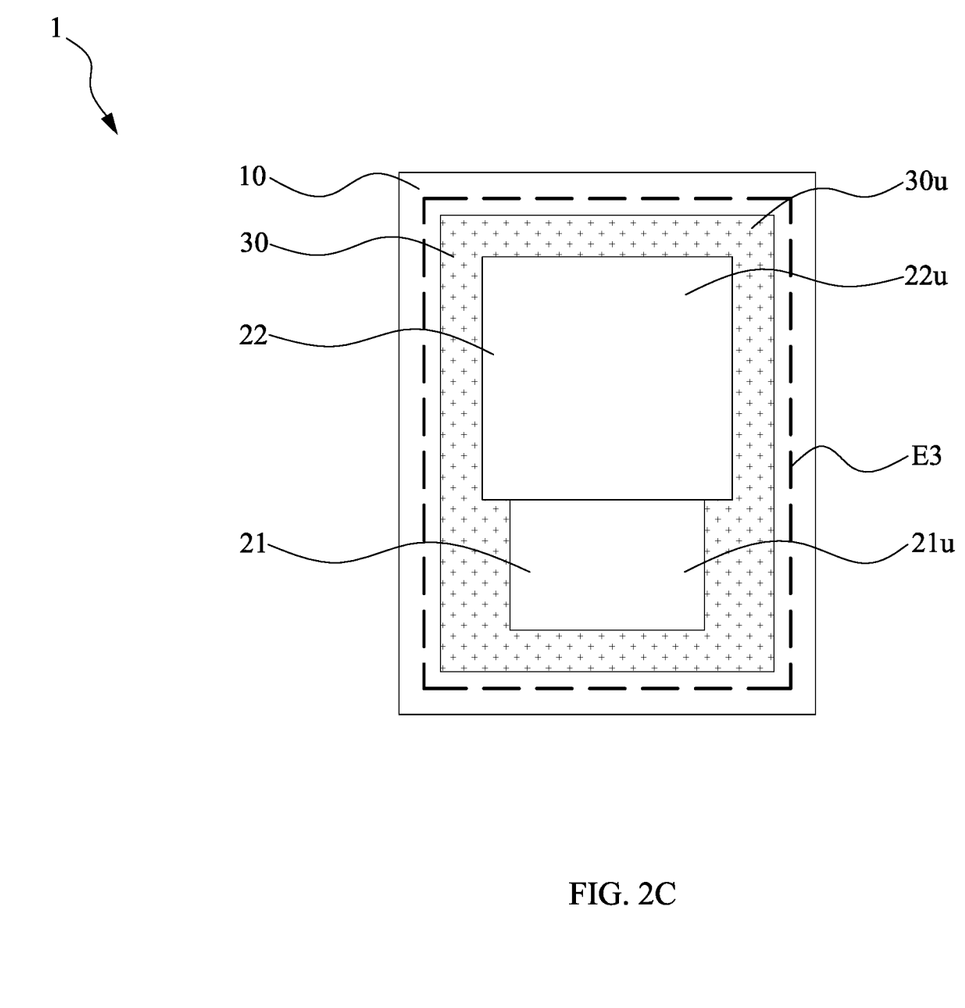

Referring to FIG. 2C, the method of manufacturing a semiconductor package structure may include Step III: irradiating the device 21, the device 22 and the package body 30 by an energy-beam E3. The energy-beam E3 may be used to heat the material for forming bonding joints (e.g., bonding material(s)) disposed on or at the lower surface of the package body 30 through irradiating the package body 30. In some embodiments, the third energy-beam may cover an entire upper surface of the semiconductor structure. The energy-beam E3 may cover the surface 30u of the package body 30, the surface 21u of the device 21 and the surface 22u of the device 22. In some embodiments, the surface 30u of the package body 30, the surface 22u of the device 22 and the surface 21u of the device 21 may be completely covered by the energy-beam E3.

The energy-beam E3 may have a third irradiation area on the upper surface of the semiconductor structure 1. In some embodiments, the third irradiation area of the energy-beam E3 may be greater than the second irradiation area of the energy-beam E2. In some embodiments, the third irradiation area of the energy-beam E3 may be substantially equal to or slightly greater than a sum of the surface area of the surface 21u of the device 21, the surface area of the surface 22u of the device 22 and the surface area surface 30u of the package body 30. The energy-beam E3 may have a third power. In some embodiments, the third power may be greater than the second power. In some embodiments, the third power may be substantially the same as or less than the first power. In some embodiments, the third power may be greater than the second power and substantially the same as or less than the first power. In some embodiments, the third power may range from about 80 W to about 200 W, such as 80, 90 W, 110 W, 130 W, 150 W, 170 W, 190 W or 200 W. The energy-beam E3 may have a third power intensity. In some embodiments, the third power intensity may be less than the first power intensity. In some embodiments, the third power intensity may be less than the second power intensity. In some embodiments, the third power intensity may be less than the first power intensity and less than the second power intensity. In some embodiments, the third power intensity may range from about 0.20 W/mm$^2$ to about 0.50 W/mm$^2$, such as 0.20 W/mm$^2$, 0.25 W/mm$^2$, 0.30 W/mm$^2$, 0.35 W/mm$^2$, 0.40 W/mm$^2$, 0.45 W/mm$^2$ or 0.50 W/mm$^2$. In some embodiments, the emission time of the energy-beam E3 may be greater than the emission time of the energy-beam E2. In some embodiments, the emission time of the energy-beam E3 may be greater than the emission time of the energy-beam E1. In some embodiments, the emission time of the energy-beam E3 may be greater than the emission time of the energy-beam E2 and the emission time of the energy-beam E1. In some embodiments, the emission time of the energy-beam E3 may range from about 1500 ms to about 3800 ms, such as 1500 ms, 2000 ms, 2500 ms, 3000 ms, 3500 ms or 3800 ms. The emission time of the energy-beam E3 may be adjusted depending on the selected power or power intensity of E3.

The semiconductor structure 1 may receive a third energy per unit of irradiated area from the energy-beam E3 in Step III. In some embodiments, the third energy per unit of irradiated area may be close to or substantially the same as the first energy per unit of irradiated area or the second energy per unit of irradiated area. In some embodiments, the third energy per unit of irradiated area may range from about 0.6 times to 1.5 times of the first energy per unit of irradiated area or the second energy per unit of irradiated area, such as 0.6 times, 0.8 times, 0.9 times, 1.0 time, 1.1 times, 1.2 times, 1.3 times or 1.5 times of the first energy per unit of irradiated area or the second energy per unit of irradiated area. In some embodiments, in Step III, the material(s) for forming bonding joints disposed on or at the lower surface of the package body 30 may be melted or partially melted to form a joint structure (i.e., the electrical connectors 43 shown in FIG. 1).

Figure 2D:
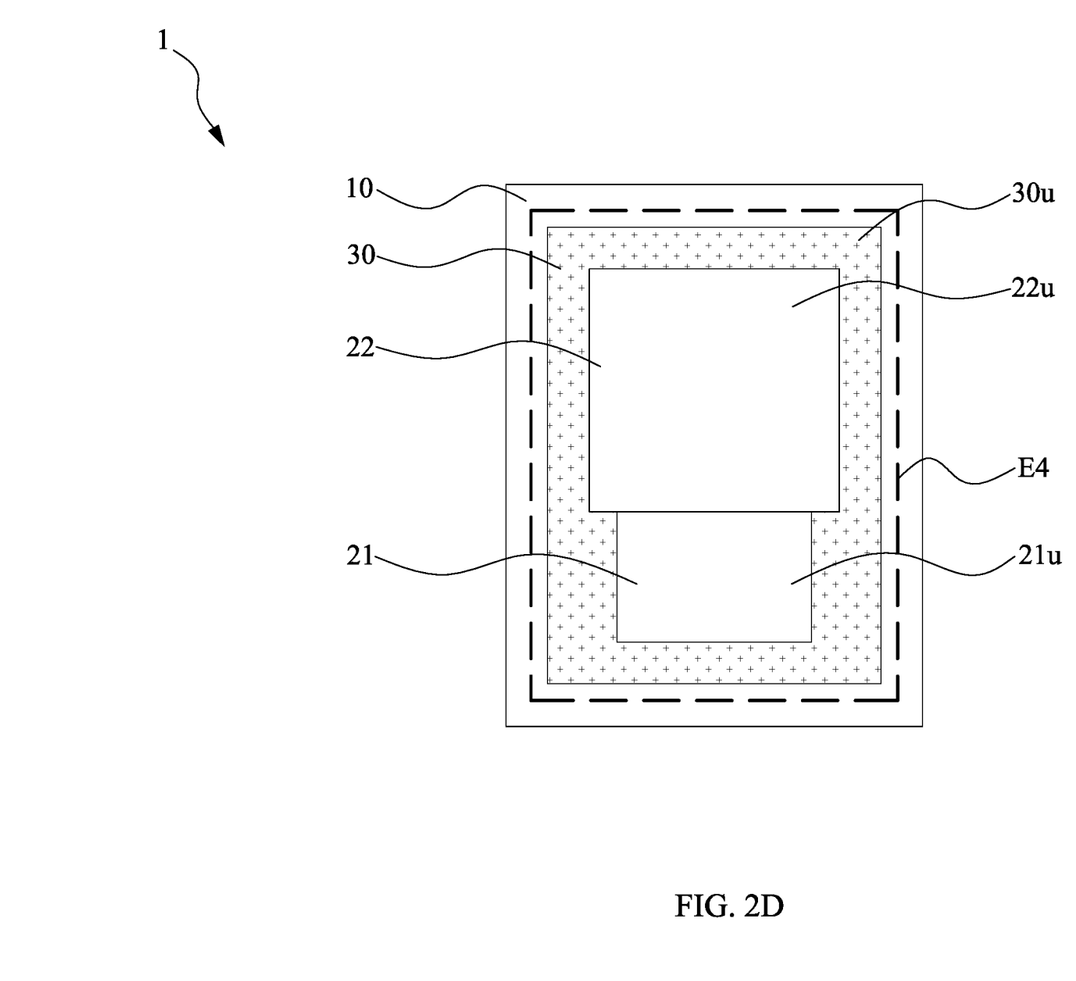

Referring to FIG. 2D, the method of manufacturing a semiconductor package structure may include Step IV: irradiating the device 21, the device 22 and the package body 30 by an energy-beam E4. The energy-beam E4 may have a fourth irradiation area on the upper surface of the semiconductor structure 1. In some embodiments, the fourth irradiation area of the energy-beam E4 may be substantially equal to the third irradiation area of the energy-beam E3. The energy-beam E4 may have a fourth power. In some embodiments, the fourth power may be less than the third power. In some embodiments, the fourth power may range from about 60 W to about 150 W, such as 60 W, 80 W, 100 W, 120 W, 140 W or 150 W. The energy-beam E4 may have a fourth power intensity. In some embodiments, the fourth power intensity may be less than the third power intensity. In some embodiments, the emission time of the energy-beam E4 may range from about 300 ms to about 700 ms, such as 300 ms, 400 ms, 500 ms, 600 ms, or 800 ms.

In some embodiments, Steps I-IV uses energy-beams with different irradiation areas, power intensities and emission times to cover the device 21, the device 22 and/or the package body 30. The device 21, the device 22 and the package body 30 may have different thermal conductivities and specific heats, and therefore, their temperature may increase at different velocities when irradiated by the energy-beam(s). For example, when an energy-beam irradiates on the device 21 and on the package body 30, the temperature of the package body 30 may increase faster than the temperature of the device 21, and therefore the package body 30 may be prone to being damaged due to overheating. In the embodiments of the present disclosure, the irradiation areas, powers, power intensities and emission times are controlled such that the bonding joints between the substrate 10 and the device 21 and 22 and the bonding joints between the substrate 10 and the package body 30 can be formed without making the temperatures of the device 21, the device 22 and the package body 30 become too high.

Figure 3:
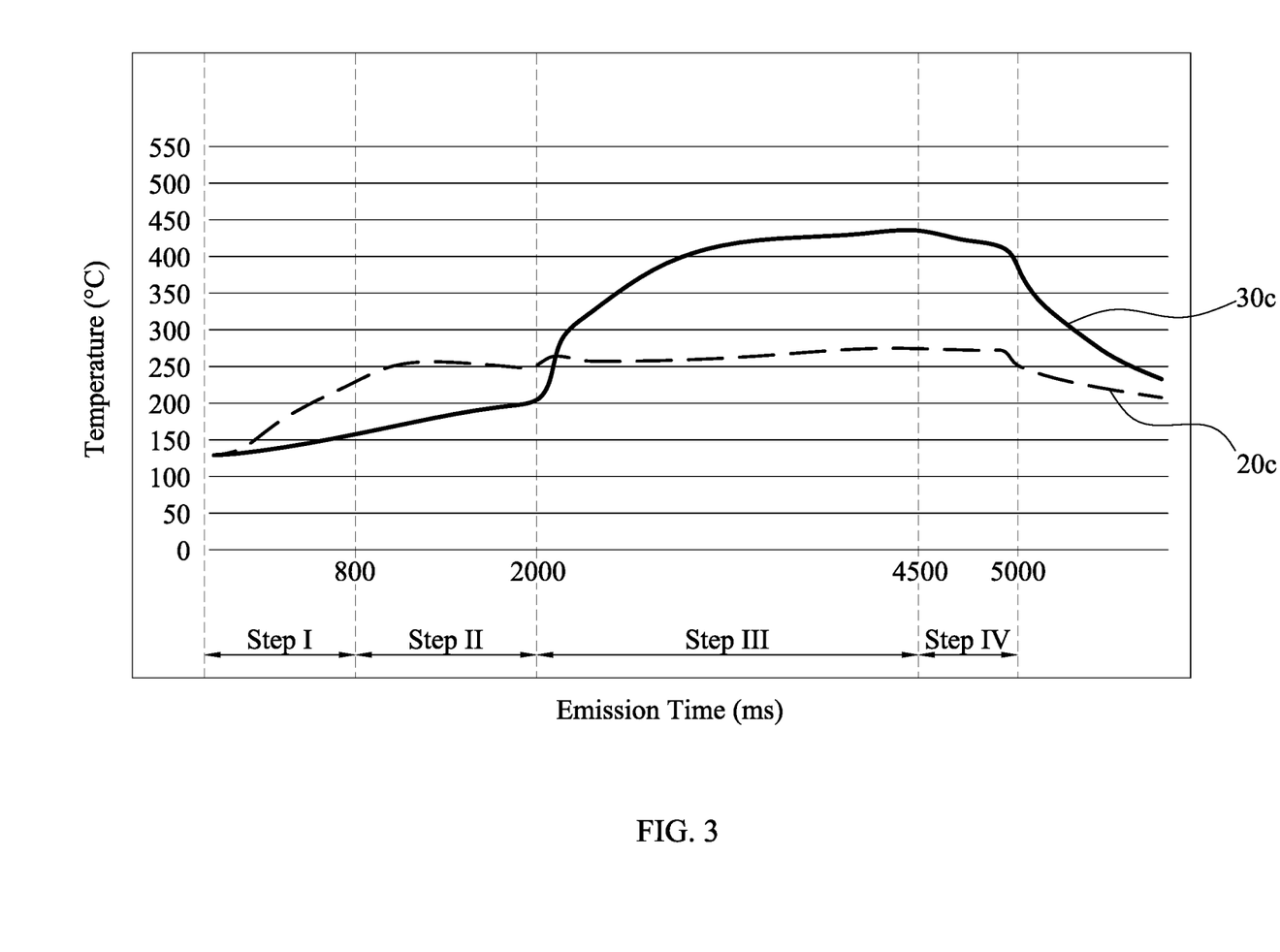
FIG. 3 is the simulation result of temperatures of a device and a package body in each step shown in FIGS. 2A, 2B, 2C and 2D.

FIG. 3 is the simulation result of temperatures of the device 21 and the package body 30 in each step shown in FIGS. 2A, 2B, 2C and 2D. Line 20c may mean the temperature of the device 21 versus emission time of energy beams, and line 30c may mean the temperature of the package body 30 versus emission time of energy beams. The irradiation areas of the energy-beam E1, energy-beam E2, energy-beam E3 and energy-beam E4 are 121 mm$^2$, 156 mm$^2$, 400 mm$^2$, and 400 mm$^2$, respectively. The emission times of the energy-beam E1, energy-beam E2, energy-beam E3 and energy-beam E4 are 800 ms, 1200 ms, 2500 ms, and 500 ms, respectively. The powers of the energy-beam E1, energy-beam E2, energy-beam E3 and energy-beam E4 are 130 W, 100 W, 130 W, and 100 W, respectively.

In Step I, the energy-beam E1 irradiates the entire upper surface of the device 21 and a portion of the upper surface of the device 22, but does not irradiate the upper surface of the package body 30. The surface area of the upper surface of the device 21 is less than the surface area of the upper surface of the device 22. The sum of the irradiated surfaces of the devices 21 and 22 are as large as possible. The bulk material of the devices 21 and 22 may include silicon and the bulk material for the package body 30 may include an epoxy-based molding compound. Since the package body 30 is substantially free from being irradiated by the energy-beam E1, an energy-beam with greater power intensity and less emission time may be used. In Step I, the temperature of the device 21 increases faster than the temperature of the package body 30.

In Step II, the energy-beam E2 is used to irradiate the entire upper surfaces of the device 21 and device 22 with an irradiation area greater than that of the energy-beam E1. Further, a portion of the package body 30 is also irradiated by the energy-beam E2. The irradiated portion of the package body 30 may surround the device 21 as illustrated in FIG. 2B. In order to prevent the package body 30 from being overheated, the power intensity of the energy-beam E2 may be less than that of the energy-beam E1. Further, the emission time of the energy-beam E2 may be greater than that of the energy-beam E1 so that the energy per unit of irradiated area of Steps I and II may be close to each other or only in a relatively small difference. In Step II, the temperature of the device 21 may have a slightly change, and the temperature of the package body 30 may increase at a velocity substantially the same as that in Step I. During Steps I and II, energy can be transmitted to the interface between the substrate 10 and the device 21 and the interface between the substrate 10 and the device 22 where bonding joints are intended to be formed.

In Step III, since bonding joints can also be formed at the interface between the substrate 10 and the package body 30, the energy-beam E3 having an irradiation area greater than that of the energy-beam E2 is used to irradiate the entire upper surfaces of the device 21, device 22 and package body 30. In order to prevent the package body 30 from being overheated, the power intensity of the energy-beam E3 may be less than that of the energy-beam E1, or even less than that of the energy-beam E2. Further, the emission time of the energy-beam E3 may be greater than that of the energy-beam E2 so that the energy per unit of irradiated area of Step III may be close to the energy per unit of irradiated area of Step II (and or Step I) or only in a relatively small difference with the energy per unit of irradiated area of Step II (and or Step I). In Step III, the temperature of the device 21 may be substantially unchanged, and the temperature of the package body 30 may increase sharply and exceed than that of the device 21. During Step III, energy can be transmitted to the interface between the substrate 10 and the device 21, the interface between the substrate 10 and the device 22 and the interface between the substrate 10 and the package body 30 where bonding joints are intended to be formed.

During Steps I, II and III, the material for forming the bonding joints located at the interfaces may absorb sufficient energy so that they can be melted or partially melted to form the bonding joints. Furthermore, when sufficient energy is transmitted to the material for forming the bonding joints located at the interfaces, an energy-beam with a smaller power can be used in the subsequent step (i.e., Step IV) before turning off the equipment for supplying energy beams, thereby problems due to sudden power change can be avoided. In some embodiments, an energy-beam with a smaller power should be used to replace the energy-beam E3 before the package body 30 reaches its critical point at which the package body 30 may be damaged due to overheat. In some embodiments, an energy-beam with a smaller power is used to replace the energy-beam E3 when the package body 30 reaches a temperature of 450° C. or below.

As discussed above, in Step IV, the energy-beam E4 may be used with relatively small power to prevent the energy-beam source from damage due to suddenly turning off the energy-beam source. In Step IV, the temperature of the device 21 may be substantially unchanged, and the temperature of the package body 30 may decrease.

In a comparative example, a first energy-beam and a second energy-beam are used to irradiate the devices 21 and 22 and the package body 30. The first energy-beam and the second energy-beam have the same irradiation area and irradiate the entire upper surfaces of the devices 21 and 22 and the package body 30. The first energy-beam has a power of 100 W and the emission time is 4000 ms. The second energy having a higher power (e.g., 150 W) is used to ensure that each of the bonding joints can be successfully formed, and the emission time is decreased to 1000 ms. Since the package body is irradiated by both of the first energy-beam and the second first energy-beam, the temperature of the package body may reach a relatively high temperature (e.g., 450° C.) quickly. As a result, the package body may be damaged. As compared to the comparative example, in the embodiments according to the present disclosure, the temperature of the package body 30 may be controlled to be less than 450° C. in each step, and the package body 30 may keep at a temperature more than 400° C. with a shorter time (e.g., 2000 ms or less). Therefore, sufficient heat can be applied to the interface between the substrate 10 and the devices 21 and 22 and the interface between the substrate 10 and the package body 30, but the package body 30 can be free from being overheated, thereby the reliability of the semiconductor package structure can be improved.

Figure 4:
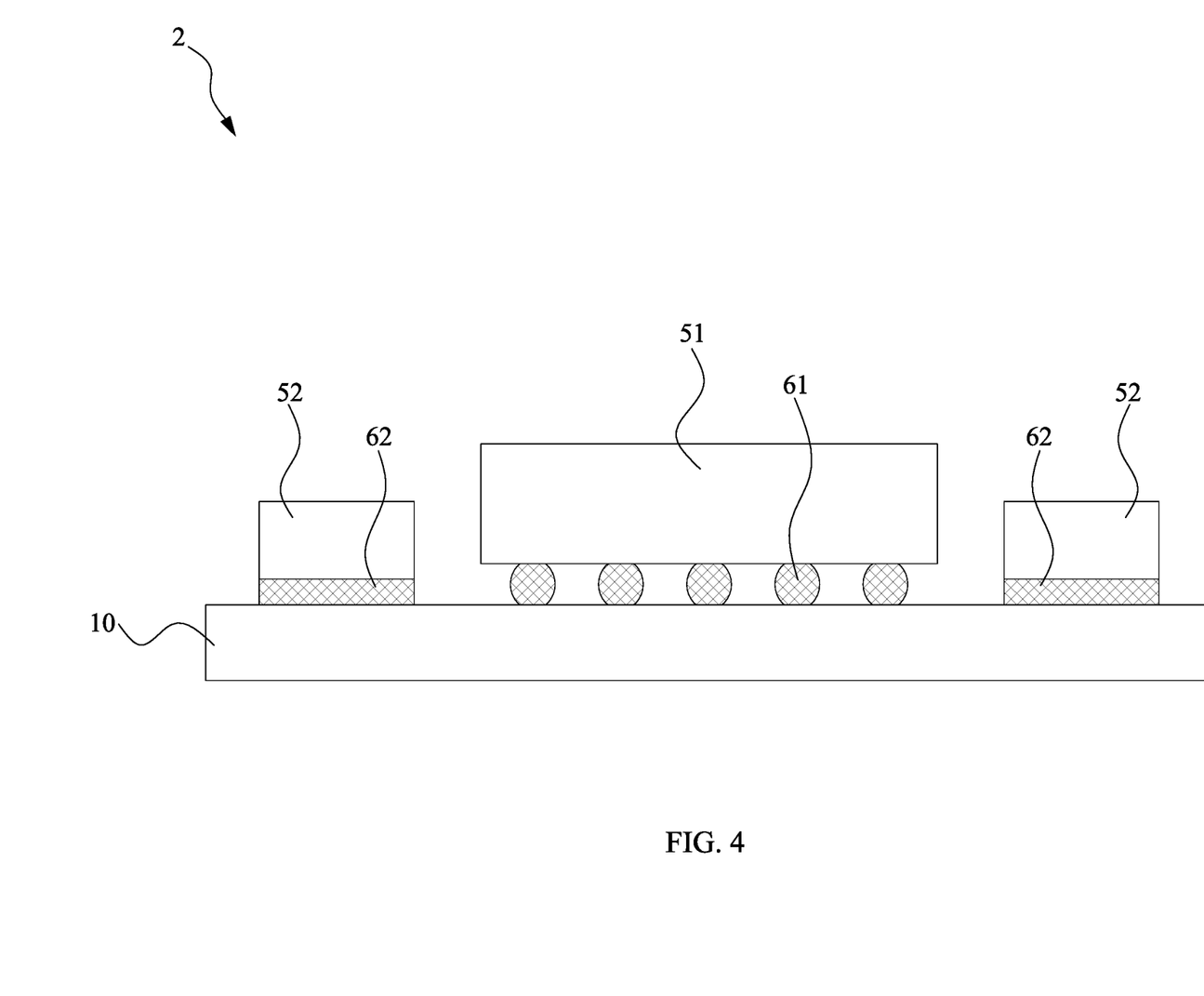
FIG. 4 illustrates a cross-sectional view of an example of a semiconductor structure according to some embodiments of the present disclosure.

FIG. 4 illustrates a cross-sectional view of an example of a semiconductor structure 2 according to some embodiments of the present disclosure.

In some embodiments, the semiconductor structure 2 may include a substrate 10, a device 51, device(s) 52, electrical connectors 61 and electrical connector(s) 62.

The device 51 may be disposed on the substrate 10. The device 51 may include an active device. The device 51 may be the same as the device 21 or the same as a combination of the devices 21 and 22. The device(s) 52 may be disposed on the substrate 10. The device(s) 52 may include passive device(s), such as capacitor(s), resistor(s), inductor(s) or other passive device(s). In some embodiments, the device 52 may be separated from the device 51.

The electrical connectors 61 may be disposed between the device 51 and the substrate 10. The electrical connectors 61 may joint the conductive element(s) (e.g., the RDL, not shown) of the substrate 10 and the conductive elements (e.g., the pads) of the device 51. The electrical connector 61 may include, for example, solder balls, controlled collapse chip connection (C4) bumps, micro bumps, or other electrical connectors. The electrical connector 62 may be disposed between the device 52 and the substrate 10. The electrical connector 62 may joint the conductive element(s) (e.g., the RDL, not shown) of the substrate 10 and the conductive elements (e.g., the electrical contacts) of the device 52. The electrical connector 62 may be formed of bonding material(s). In some embodiments, the electrical connector 62 may include, for example, solder paste or other suitable materials. In some other embodiments, the method of the present disclosure may be carried out without the presence of the electrical connectors 61 and/or 62. In some other embodiments, the method of the present disclosure may be applied to direct bonding technique.

In some embodiments, energy-beam(s) is used to provide heat to an interface between the substrate 10 and the device 51 or 52 for forming bonding joints. For example, in some embodiments, energy-beam(s) is used to provide heat such that the material of electrical connector 61 and/or the electrical connector 62 may be melted or fused and form the electrical connectors 61 and/or electrical connector(s) 62 after cooling (or annealing). The energy-beam(s) may irradiate the upper surfaces of the device 51 and the device 52 and pass through the device 51 and the device 52 to provide heat to the interface. In some embodiments, the energy-beam(s) is laser. In some embodiments, a laser assisted bonding (LAB) technique is adopted to provide energy-beam(s) for forming bonding joints.

Figure 5A:
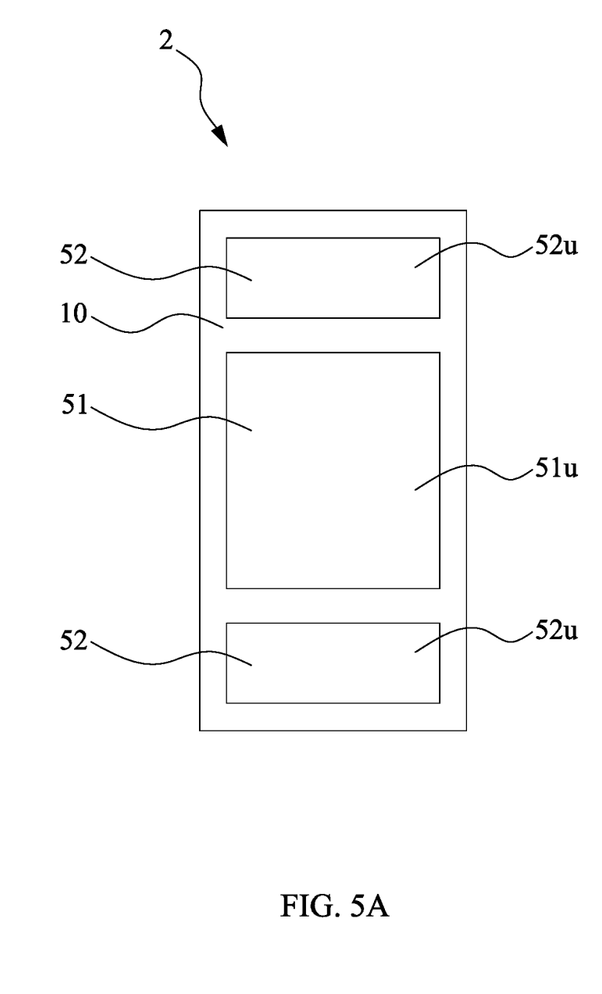
FIGS. 5A, 5B and 5C illustrate top views of various stages of a method for manufacturing a semiconductor package structure according to some embodiments of the present disclosure.
Figure 5B:
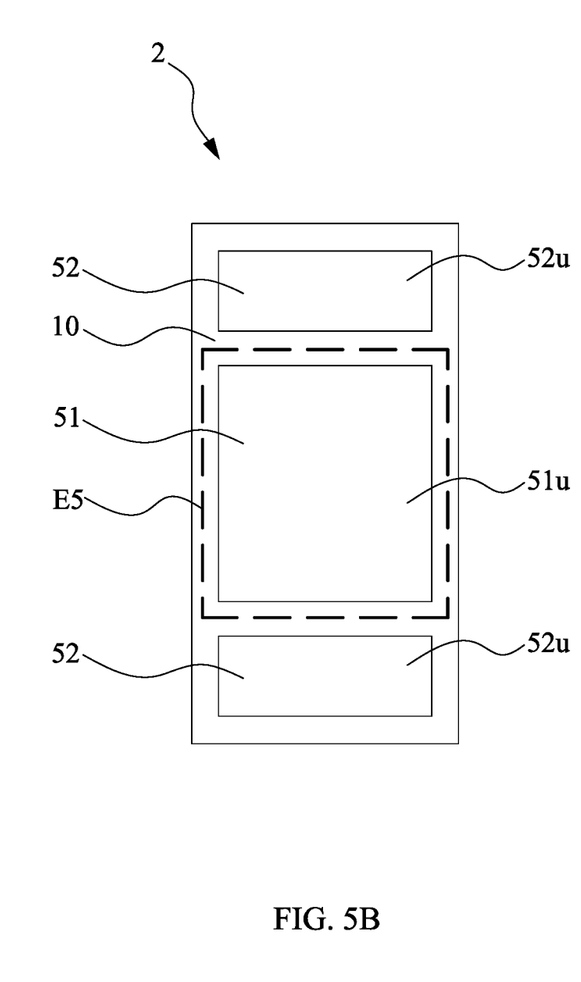
Figure 5C:
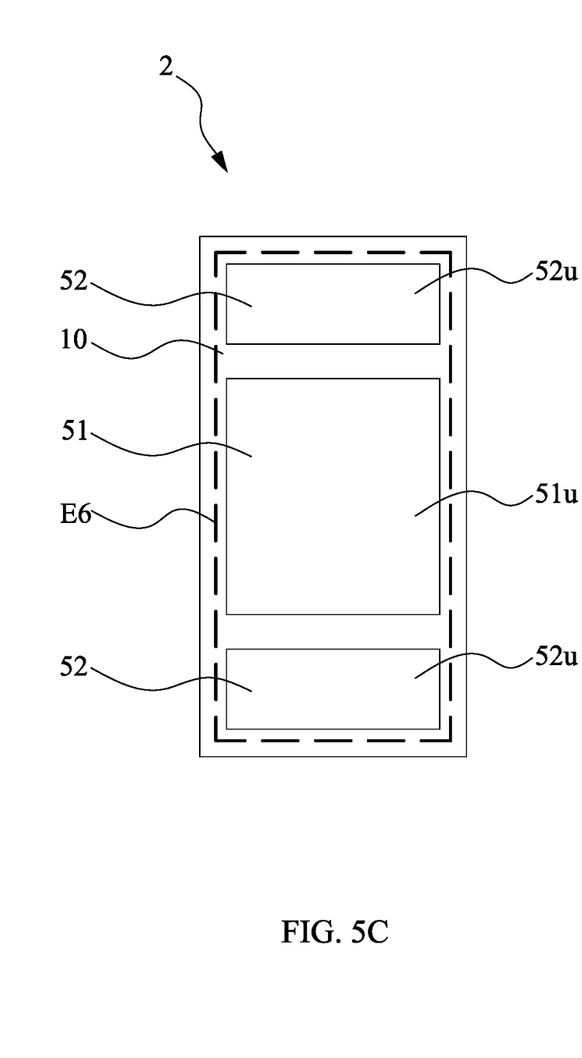
Figure 6A:
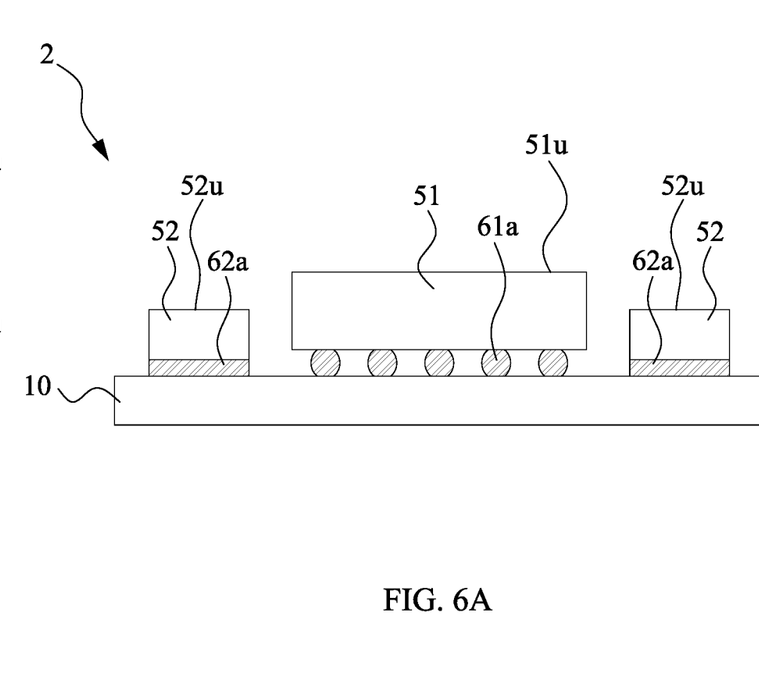
FIGS. 6A, 6B and 6C illustrate cross-sectional views of the method for manufacturing the semiconductor package structure corresponding to FIGS. 5A, 5B and 5C, respectively.
Figure 6B:
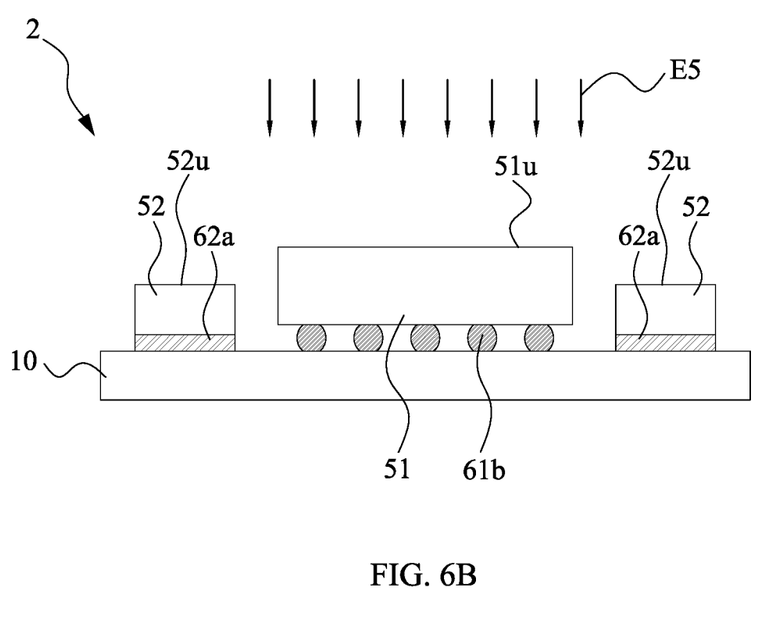
Figure 6C:
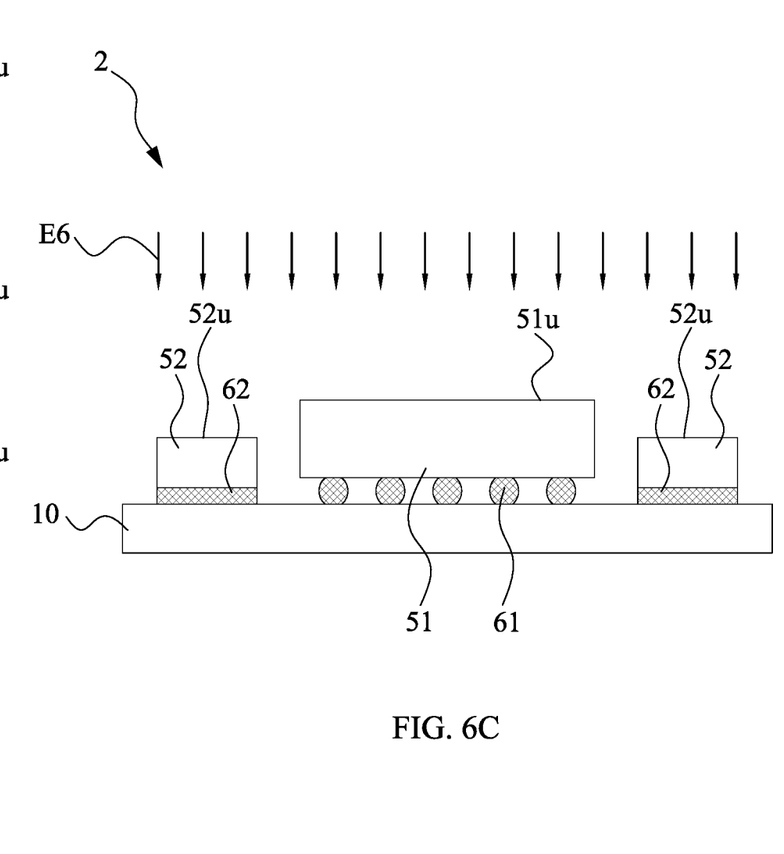

FIGS. 5A, 5B and 5C illustrate top views of various stages of a method for manufacturing a semiconductor package structure according to some embodiments of the present disclosure, and FIGS. 6A, 6B and 6C illustrate cross-sectional views of the method corresponding to FIGS. 5A, 5B and 5C, respectively.

Referring to FIGS. 5A and 6A, a semiconductor structure 2 may be provided. The device 51 and the device(s) 52 may be separated from each other. In some embodiments, the device 51 may be disposed at a center region of an upper surface of the substrate 10 and the device 52 may be disposed at a peripheral region of an upper surface of the substrate 10. In some embodiments, a surface area of the surface 51u of the device 51 may be different from a surface area of the surface 52u of the device 52. For example, the surface area of the surface 51u of the device 51 may be greater than or exceeding the surface area of the surface 52u of the device 52. Bonding material(s) 61a may be disposed between the device 51 and the substrate 10. Bonding material(s) 62a may be disposed between the device 52 and the substrate 10.

Referring to FIGS. 5B and 6B, the method of manufacturing a semiconductor package structure may include Step I: heating the device 51 by an energy-beam E5. The energy-beam E5 may be used to heat the material for forming bonding joints (e.g., the bonding material 61a) disposed on or at the lower surface of the device 51 through irradiating the device 51. The energy-beam E5 may cover the surface 51u of the device 51. In some embodiments, the energy-beam E5 may cover the entire upper surface (e.g., the surface 51u) of the device 51. In some embodiments, the device 52 may be substantively free from being irradiated by the energy-beam E5. In some embodiments, the surface 52u of the device 52 has an edge spaced from the first irradiation area of the energy-beam E5. In some embodiments, a smallest distance between an edge of the surface 52u of the device 52 and the irradiation area (i.e., a peripheral edge of the irradiation area) of the energy-beam E5 is greater than zero. In some embodiments, the bonding material 61a becomes bonding material 61b after performing the Step I. In some embodiments, the bonding material 61a absorbs a portion of energy necessary for forming electrical connectors 61 during Step I.

Referring to FIGS. 5C and 6C, the method of manufacturing a semiconductor package structure may include Step II: heating the device 51 and the device 52 by an energy-beam E6. The energy-beam E6 may be used to heat the material for forming bonding joints (e.g., the bonding material 61b and the bonding material 62a) disposed on or at the lower surfaces of the device 51 and the device 52 through irradiating the device 51 and the device 52. The energy-beam E6 may cover the surface 51u of the device 51 and the surface 52u of the device 52. In some embodiments, the energy-beam E6 may cover the entire upper surface (e.g., the surface 51u) of the device 51 and the entire upper surface (e.g., the surface 52u) of the device 52. In some embodiments, the bonding material(s) 61b becomes the electrical connectors 61, and the bonding material(s) 62a becomes the electrical connector(s) 62 during or after performing Step II. That is, the bonding material 61b and the bonding material 62a may absorb sufficient energy for forming electrical connectors 61 and 62 during or after Step II. In some embodiments, the irradiation area of the energy-beam E6 may be greater than the irradiation area of the energy-beam E5. In some embodiments, the power of the energy-beam E6 may be greater than the power of the energy-beam E5. In some embodiments, the power of the energy-beam E6 may range from about 1.2 times to about 1.6 times of the power of the energy-beam E5, such as 1.2 times, 1.3 times, 1.4 times, 1.5 times or 1.6 times. In some embodiments, the emission time of the energy-beam E6 may be less than the emission time of the energy-beam E5. In some embodiments, the emission time of the energy-beam E6 may range from about 0.3 times to about 0.8 times of the emission time of the energy-beam E5, such as 0.3 times, 0.4 times, 0.5 times, 0.6 times, 0.7 times or 0.8 times. In some embodiments, the energy density of the energy-beam E6 may range from about 0.6 times to about 1.5 times of the energy density of the energy-beam E5, such as 0.6 times, 0.7 times, 0.8 times, 0.9 times, 1.0 time, 1.1 times, 1.2 times, 1.3 times or 1.5 times.

Since the device 51 is separated from the device 52, the heat cannot be transmitted directly between the device 51 and the device 52. Therefore, the amount of heat received by the device 51 is substantially independent from the amount of heat received by the device 52. In some embodiment, the thermal budget for forming a joint structure at the interface between the substrate 10 and the device 51 (e.g., forming electrical connectors 61 from the bonding material 61a) is greater than the thermal budget for forming a joint structure at the interface between the substrate 10 and the device 52 (e.g., forming electrical connectors 62 from the bonding material 62a). In such embodiments, the energy beams can be designed so that the interface between the substrate 10 and the device 51 receives energy in both of Step I and Step II, the interface between the substrate 10 and the device 52 receives energy in Step II, and the total energy received at each of the interfaces meets the thermal budget for forming the joint structure.

It is contemplated that the sequence between Step I and Step II can be exchanged. In some embodiments, Step I may be performed after Step II. In some embodiments, Step II may be performed after Step I. In some embodiments, in a step where a greater irradiation area is used, a smaller power of the energy-beam may be adopted such that the energy per unit of irradiated area in Step I may be close to or substantially the same as the energy per unit of irradiated area in Step II.

In a comparative example where the joint structure between the substrate 10 and the device 51 is formed during or after Step I but before Step II, an energy-beam with a greater power is needed since the formation of the joint structure between the substrate 10 and the device 51 requires a relatively great thermal budget. Such a relatively great power of the energy-beam may damage the substrate, and therefore the reliability of the semiconductor package structure may be damaged. In another comparative example, in a first step the device 52 and a mask is disposed on the substrate 10; in a second step, an energy beam irradiates the upper surface of the device 52 and the upper surface of the mask, the energy beam supplies energy for forming a joint structure between the substrate 10 and the device 52, and the mask protects the underlying substrate from being damaged by the energy-beam; in a third step, the mask is removed and the device 51 is disposed on the substrate 10 at a position that was covered and protected by the mask in the second step; in a fourth step, an energy beam irradiates the upper surface of the device 51 and supplies energy for forming a joint structure between the substrate 10 and the device 51. Although in this comparative embodiment, the energies supplied for forming the joint structure between the substrate 10 and the device 51 and for forming the joint structure between the substrate 10 and the device 52 can be easily controlled, the formation and removal of the mask increases the manufacturing time and the complexity of the manufacturing process. In comparison with comparative examples, the material for forming electrical connectors 61 absorbs energy in two steps with two different energy-beams. Therefore, the energy-beam used in Step I may have a relatively small power so that the damage of the substrate 10 can be prevented. Further, in Step II the material for forming electrical connectors 61 continue absorbing energy and the material for forming the electrical connector 62 starts to absorb energy. Thus, the electrical connectors 61 and 62 can be formed after Step II and the sum of emission times as well as the sum of energy of the energy beams E5 and E6 in Step I and Step II may be less than those of the comparative example. As a result, the manufacturing time can be reduced and a simple manufacturing method can be achieved.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
    (a) providing a semiconductor structure comprising a first device and a second device;
    (b) irradiating the first device by a first energy-beam with a first irradiation area; and
    (c) irradiating the first device and the second device by a second energy-beam with a second irradiation area greater than the first irradiation area of the first energy-beam, wherein the semiconductor structure further comprises a package body surrounding the first device and the second device, wherein in step, the package body is substantially free from being irradiated by the first energy-beam.

2. The method of claim 1, wherein the first energy-beam covers an upper surface of the first device and the second energy-beam covers an upper surface of the first device and an upper surface of the second device.

3. The method of claim 2, wherein a surface area of the upper surface of the first device is smaller than a surface area of the upper surface of the second device.

4. The method of claim 1, wherein the first energy-beam further covers at least a portion of an upper surface of the second device.

5. The method of claim 1, wherein the first energy-beam has a first power and the second energy-beam has a second power less than the first power of the first energy-beam.

6. The method of claim 5, wherein the first energy-beam has a first power intensity and the second energy-beam has a second power intensity less than the first power intensity of the first energy-beam.

7. The method of claim 6, wherein the second energy-beam further covers at least a portion of the package body.

8. The method of claim 1, wherein after step (c), the method further comprises:
    (d) irradiating the first device, the second device and the package body by a third energy-beam with a third irradiation area greater than the second irradiation area of the second energy-beam.

9. The method of claim 8, wherein the second energy-beam has a second power and the third energy-beam has a third power greater than the second power of the second energy-beam.

10. The method of claim 9, wherein the second energy-beam has a second power intensity and the third energy-beam has a third power intensity less than the second power intensity.

11. The method of claim 8, wherein after step (d), the method further comprises:
    (e) irradiating the first device, the second device and the package body by a fourth energy-beam, and a power intensity of the fourth energy-beam is less than a power intensity of the third energy-beam.

12. The method of claim 1, wherein the first irradiation area is greater than a surface area of an upper surface of the first device.

13. The method of claim 1, wherein the second irradiation area is greater than a sum of a surface area of an upper surface of the first device and a surface area of an upper surface of the second device.

14. A method for manufacturing a semiconductor package structure, comprising:

(a) providing a semiconductor structure comprising a first device and a second device;

(b) irradiating the first device by a first energy-beam with a first irradiation area; and (c) irradiating the first device and the second device by a second energy-beam with a second irradiation area greater than the first irradiation area of the first energy-beam, wherein the first energy-beam covers an upper surface of the first device and the second energy-beam covers an upper surface of the first device and an upper surface of the second device, and wherein the upper surface of the second device has an edge spaced from the first irradiation area of the first energy-beam.

15. The method of claim 14, wherein the first energy-beam has a first power and the second energy-beam has a second power greater than the first power of the first energy-beam.

16. A method for manufacturing a semiconductor package structure, comprising:

(a) providing a substrate, a first device and a second device, wherein the first device and the second device are disposed on the substrate;

(b) heating the first device by a first energy-beam with a first power; and (c) heating the first device and the second device by a second energy-beam with a second power, wherein the second power is greater than the first power.

17. The method of claim 16, wherein a first thermal budget for forming a joint structure between the first device and the substrate is greater than a second thermal budget for forming a joint structure between the first device and the substrate.

18. The method of claim 16, wherein in step (b), the second device is substantially free from being irradiated by the first energy-beam.

19. The method of claim 16, wherein the device is an active device and the second device is a passive device.

* * * * *